(12) United States Patent
Rhee et al.

(10) Patent No.: US 7,776,641 B2
(45) Date of Patent: Aug. 17, 2010

(54) ORGANIC LIGHT EMITTING DISPLAY DEVICE AND METHOD FOR MANUFACTURING THE SAME

(75) Inventors: Jung-Soo Rhee, Seoul (KR); Dong-Won Lee, Seongnam-si (KR); Sang-Woo Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 158 days.

(21) Appl. No.: 12/074,209

(22) Filed: Feb. 29, 2008

(65) Prior Publication Data
US 2008/0230775 A1 Sep. 25, 2008

(30) Foreign Application Priority Data
Mar. 21, 2007 (KR) ............... 10-2007-0027579

(51) Int. Cl.
H01L 21/00 (2006.01)
(52) U.S. Cl. ............... 438/70; 257/93; 257/E21.535
(58) Field of Classification Search ............... 438/22; 257/93; H01L 27/30
See application file for complete search history.

(56) References Cited

U.S. PATENT DOCUMENTS

| | | | |
|---|---|---|---|
| 7,304,639 B2 * | 12/2007 | Park et al. ............... | 345/206 |
| 7,510,454 B2 * | 3/2009 | Ludwicki et al. ............... | 445/23 |
| 2004/0183083 A1 * | 9/2004 | Koo ............... | 257/88 |
| 2004/0222749 A1 * | 11/2004 | Koyama ............... | 315/169.3 |
| 2006/0146254 A1 * | 7/2006 | Kim ............... | 349/141 |
| 2007/0241331 A1 * | 10/2007 | Lee et al. ............... | 257/59 |

FOREIGN PATENT DOCUMENTS

| | | |
|---|---|---|
| JP | 2006-236683 | 9/2006 |
| KR | 10-2006-0065366 | 6/2006 |
| KR | 10-2006-0095718 | 9/2006 |

OTHER PUBLICATIONS

Patent Abstracts of Japan Publication No. 2006-236683, Sep. 7, 2006, 1 p.
Korean Patent Abstracts, Publication No. 1020060065366, Jun. 14, 2006, 1 p.
Korean Patent Abstracts, Publication No. 1020060095718, Sep. 1, 2006, 1 p.

* cited by examiner

*Primary Examiner*—Chandra Chaudhari
(74) *Attorney, Agent, or Firm*—Innovation Counsel LLP

(57) ABSTRACT

An organic light emitting display device and a method for manufacturing the same are disclosed. The method for manufacturing the organic light emitting display device includes forming a switching element and a silicon nitride layer over a substrate, patterning and removing a portion of the silicon nitride layer formed on a light emitting region through which light is transmitted, forming an overcoat layer formed on the silicon nitride layer, wherein a portion of the overcoat layer corresponding to the light emitting region has a thickness of about 1.1 μm to about 2.1 μm, forming a first electrode electrically connected to the switching element over the light emitting region, and sequentially forming an organic light emitting layer and a second electrode on the first electrode.

16 Claims, 17 Drawing Sheets

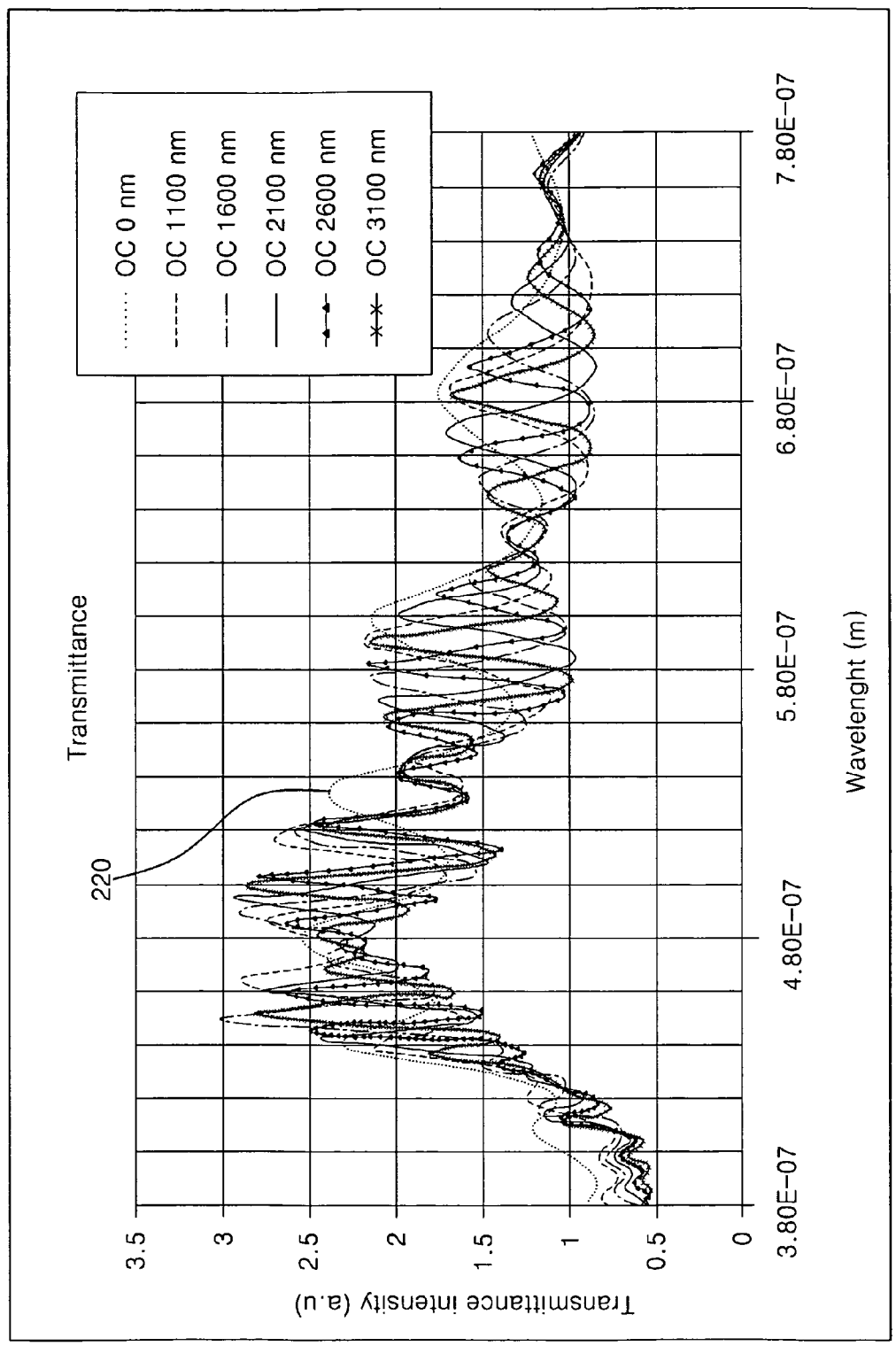

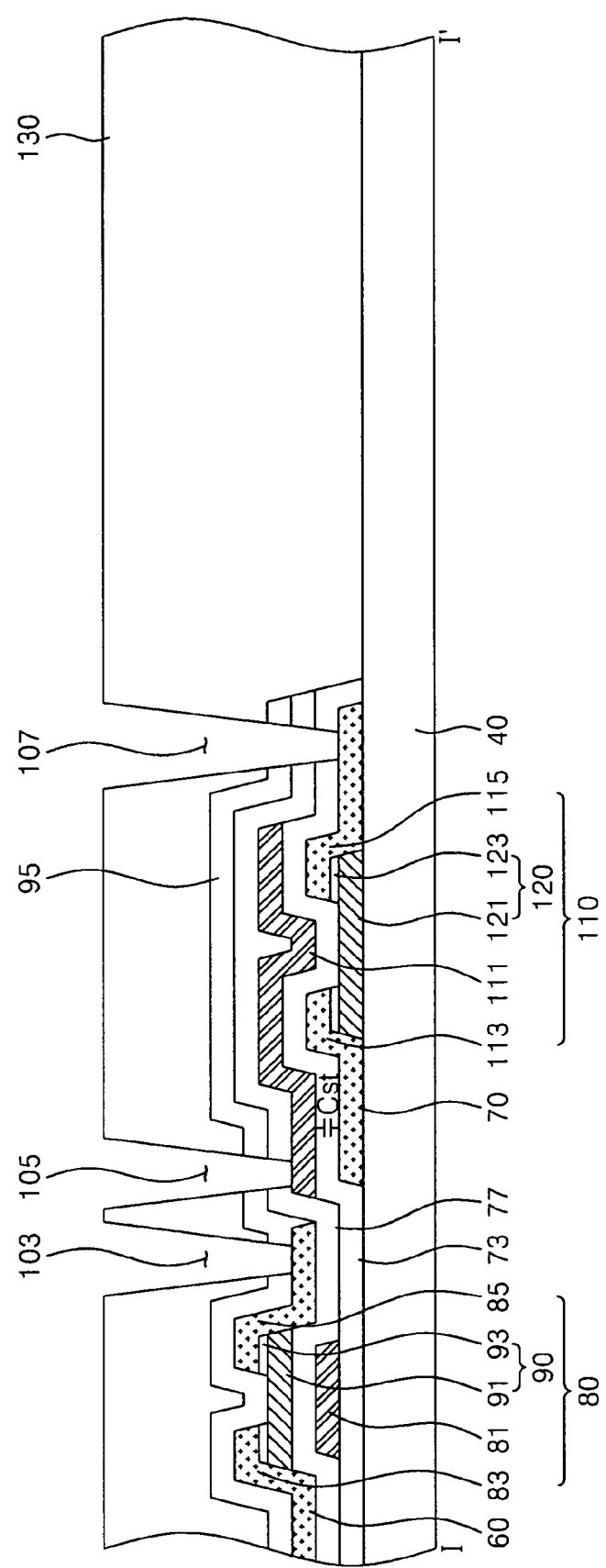

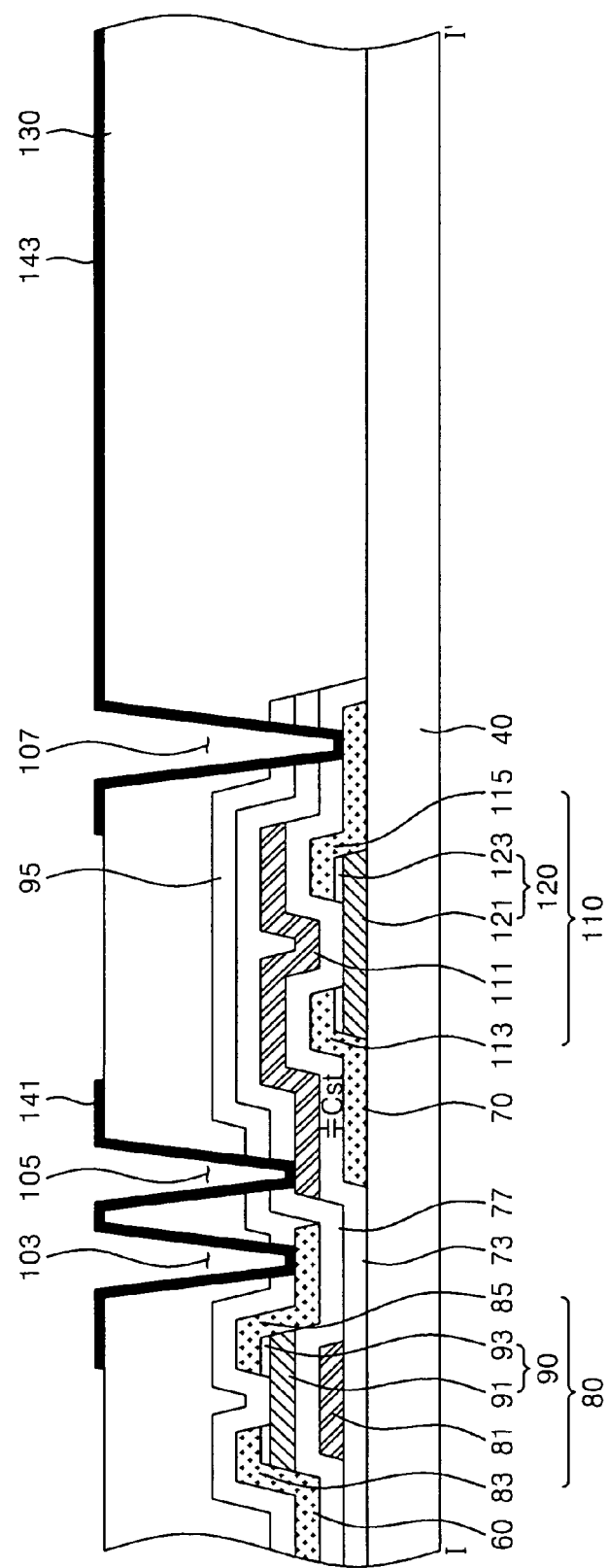

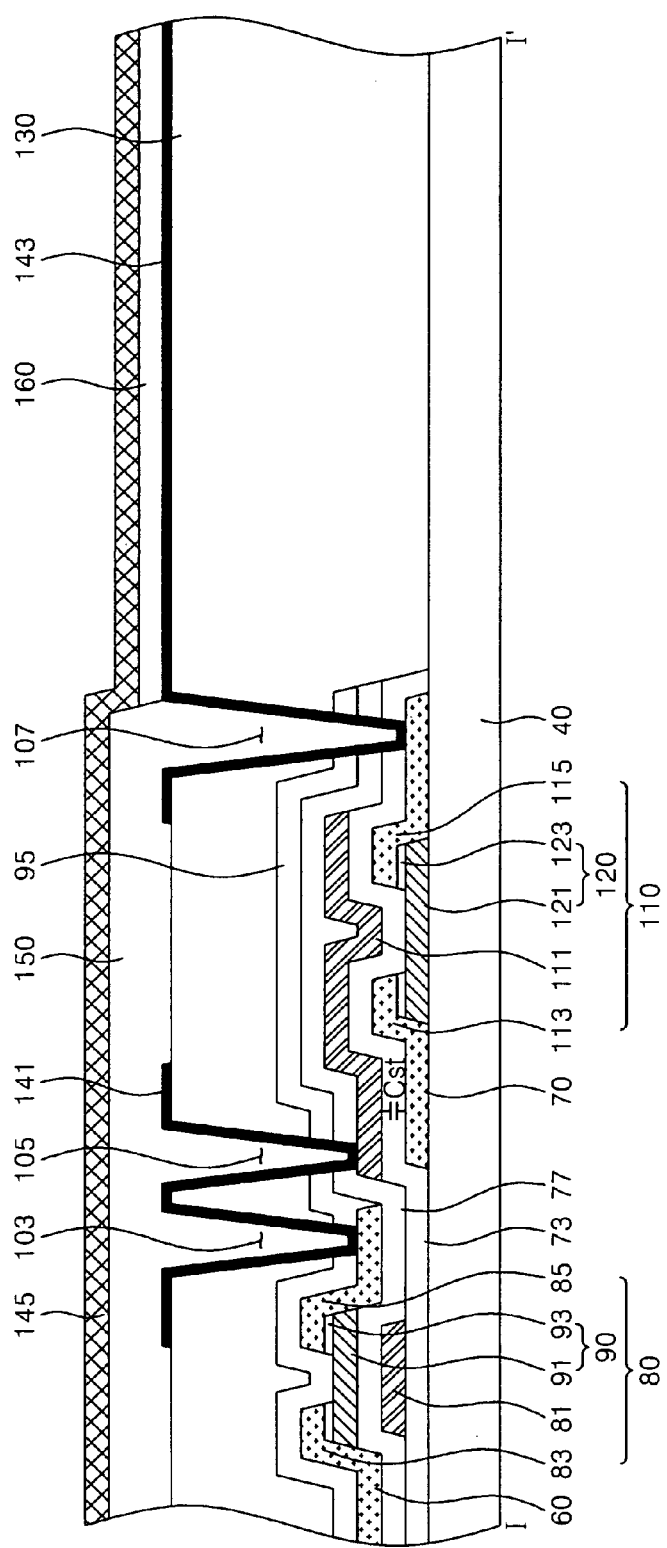

ORGANIC LIGHT EMITTING DISPLAY DEVICE AND METHOD FOR MANUFACTURING THE SAME

CROSS-REFERENCE TO RELATED APPLICATION

This application claims priority to and the benefit of Korean Patent Application No. 2007-0027579, filed on Mar. 21, 2007, the disclosure of which is incorporated herein by reference in its entirety.

BACKGROUND OF THE INVENTION

1. Field of the Invention

The present invention relates to an organic light emitting diode ("OLED") device in which a lower layer structure is modified to improve light transmittance and a method for manufacturing the same.

2. Description of the Related Art

Of flat panel display devices, an OLED device is an emissive display device and attracts public attention as a next generation flat panel display device due to merits of a fast response speed, the compact thickness, low manufacturing cost, and a high contrast.

A typical OLED device comprises an anode arranged on a substrate, a light emitting layer ("EML") arranged on the anode, and a cathode arranged on the light emitting layer. When a voltage is applied to the anode and the cathode, holes and electrons are injected into the light emitting layer, holes and electrons are recombined in the light emitting layer, generating exitons. The OLED device emits light by energy generated when the exitons transitions to a ground state from an excited state.

The OLED device is divided into a bottom emission type and a top emission type according to a direction in which light generated from the light emitting layer is emitted. In the bottom emission type, light is emitted in a down direction of a substrate, and a reflective electrode is formed on the light emitting layer and a transparent electrode is formed below the light emitting layer.

The OLED device comprises a red ("R") light emitting layer, a green ("G") light emitting layer, and a blue ("B") light emitting layer in order to realize a full color. In this instance, the light emitting layers of respective colors have different lifespans. For this reason, it is difficult to maintain a white balance if it is driven for a long time. In order to resolve the above problem, a light emitting layer which emits a single color is formed, and a color filter is formed to extract light of corresponding colors from light emitted from the light emitting layer.

An OLED device recently developed has a color filter on array ("COA") structure in which a color filter for converting a color of light below the light emitting layer is arranged on a single substrate. In this instance, if a transparent electrode is formed above the color filter, a surface becomes non-uniform due to dyes or pigments of the color filter, so that an electric field applied to the light emitting layer becomes irregular. An overcoat layer is formed on the color filter to prevent a non-uniform surface and maintain a constant electric field in the light emitting layer. Here, a silicon nitride layer which is used in a thin film transistor ("TFT") is formed below the color filter. In the OLED device with the COA structure, due to the thickness of the overcoat layer and the silicon nitride layer, transmittance of light emitted from the light emitting layer changes, thereby deteriorating brightness and a color gamut.

SUMMARY OF THE INVENTION

The present invention, therefore, solves aforementioned problems associated with conventional devices by providing an OLED device in which an overcoat layer and an insulating layer are formed at the optimum thickness to thereby improve transmittance of light emitted through its bottom and a method for manufacturing the same.

One aspect of the present invention provides a method for manufacturing an OLED device, the method comprising forming a switching element and a silicon nitride layer over a substrate, patterning and removing a portion of the silicon nitride layer formed on a light emitting region through which light is transmitted; forming an overcoat layer on the silicon nitride layer, wherein a portion of the overcoat layer corresponding to the light emitting region has a thickness of about 1.1~2.1 μm; forming a first electrode electrically connected to the switching element over the light emitting region; and sequentially forming an organic light emitting layer and a second electrode on the first electrode.

The overcoat layer is formed at a thickness of about 1.6 μm.

The step for forming the switching element comprises forming a first TFT electrically connected to a gate line and a power line with a first gate insulating layer interposed therebetween, and forming a second TFT electrically connected to a gate line and a data line with a second gate insulating layer interposed therebetween.

The step for forming the switching element further comprises forming a passivation film to protect the switching element.

The step for forming the passivation film further comprises patterning and removing a portion of the silicon nitride layer having the passivation film and the first and second gate insulating layers which overlaps the light emitting region.

The method further comprises, after forming the passivation film, forming a color filter in R, G, B and white sub-pixels.

The step for forming the color filter comprises forming R, G and B color filters below the organic light emitting layer.

Another aspect of the present invention provides an OLED device, comprising a substrate having a first region and a second region which are divided for each pixel, a switching element formed on the first region of the substrate, a silicon nitride layer formed on the switching element, an overcoat layer formed on the silicon nitride layer and the second region of the substrate, and an organic light emitting portion formed on a portion of the overcoat layer corresponding to the second region and electrically connected to the switching element.

The overcoat layer is formed at a thickness of about 1.1 μm to 2.1 μm.

The overcoat layer is formed at a thickness of about 1.6 μm.

The organic light emitting portion comprises a first electrode, an organic light emitting layer and a second electrode sequentially formed on the overcoat layer.

The OLED device further comprises a color filter formed on the substrate below the organic light emitting layer.

The pixel comprises R, G, B, and white sub-pixels.

The pixel comprises R, G, and B sub-pixels.

The overcoat layer is made of an acrylic-based material such as polyacrylate.

BRIEF DESCRIPTION OF THE DRAWINGS

The above and other features of the present invention will be described in reference to certain embodiments thereof with reference to the attached drawings, in which:

FIGS. 6 and 7 are graphs illustrating light transmittance of a silicon nitride layer and an overcoat layer according to their thickness according to an embodiment of the present invention, respectively; and FIGS. 8A to 8K are cross-sectional views illustrating a process for manufacturing the OLED device according to an embodiment of the present invention.

DETAILED DESCRIPTION

Reference will now be made in detail to the embodiments of the present invention, examples of which are illustrated in the accompanying drawings.

Figure 1:
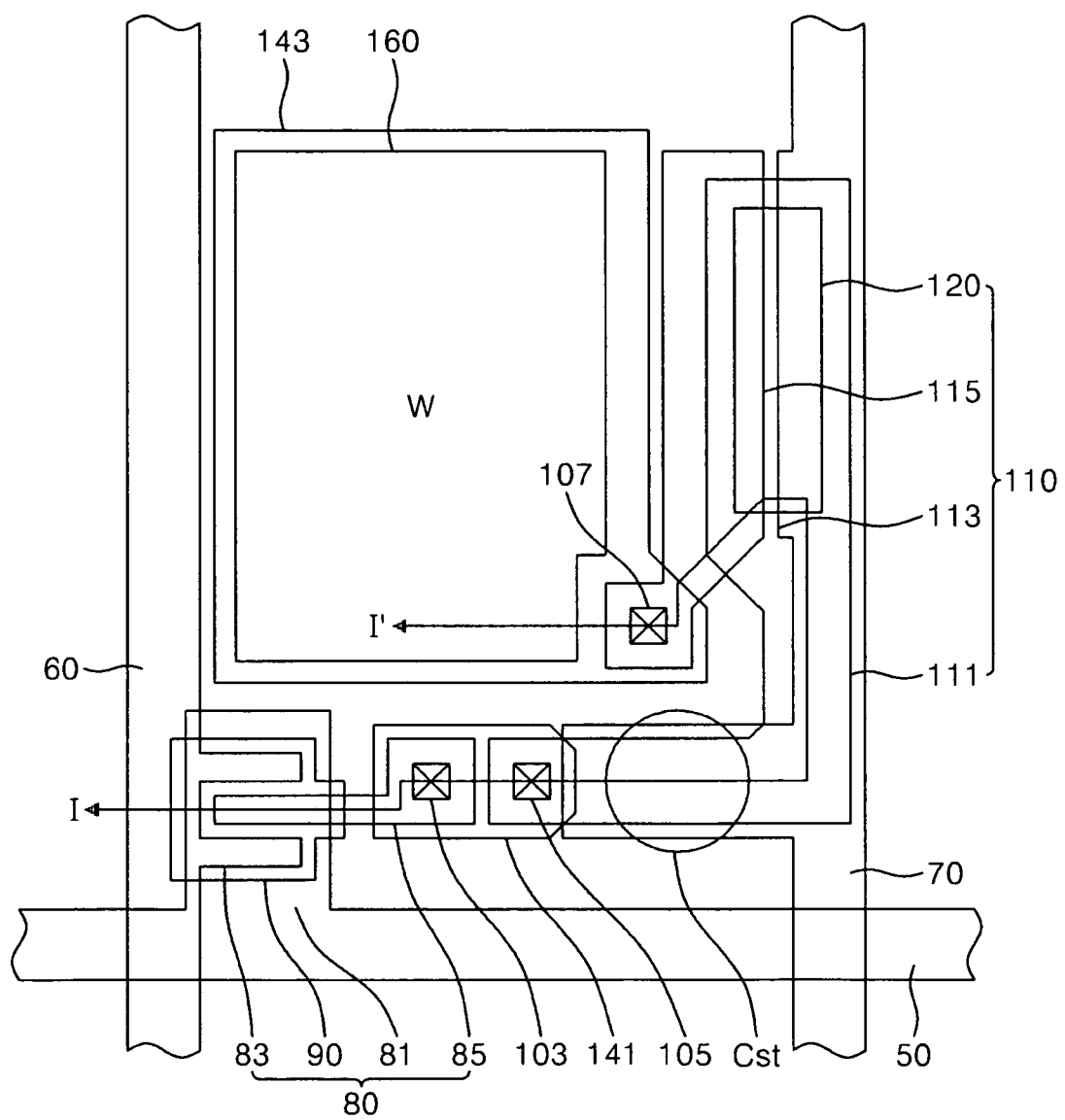
FIG. 1 is a plane view illustrating an OLED device according to an embodiment of the present invention.
Figure 2:
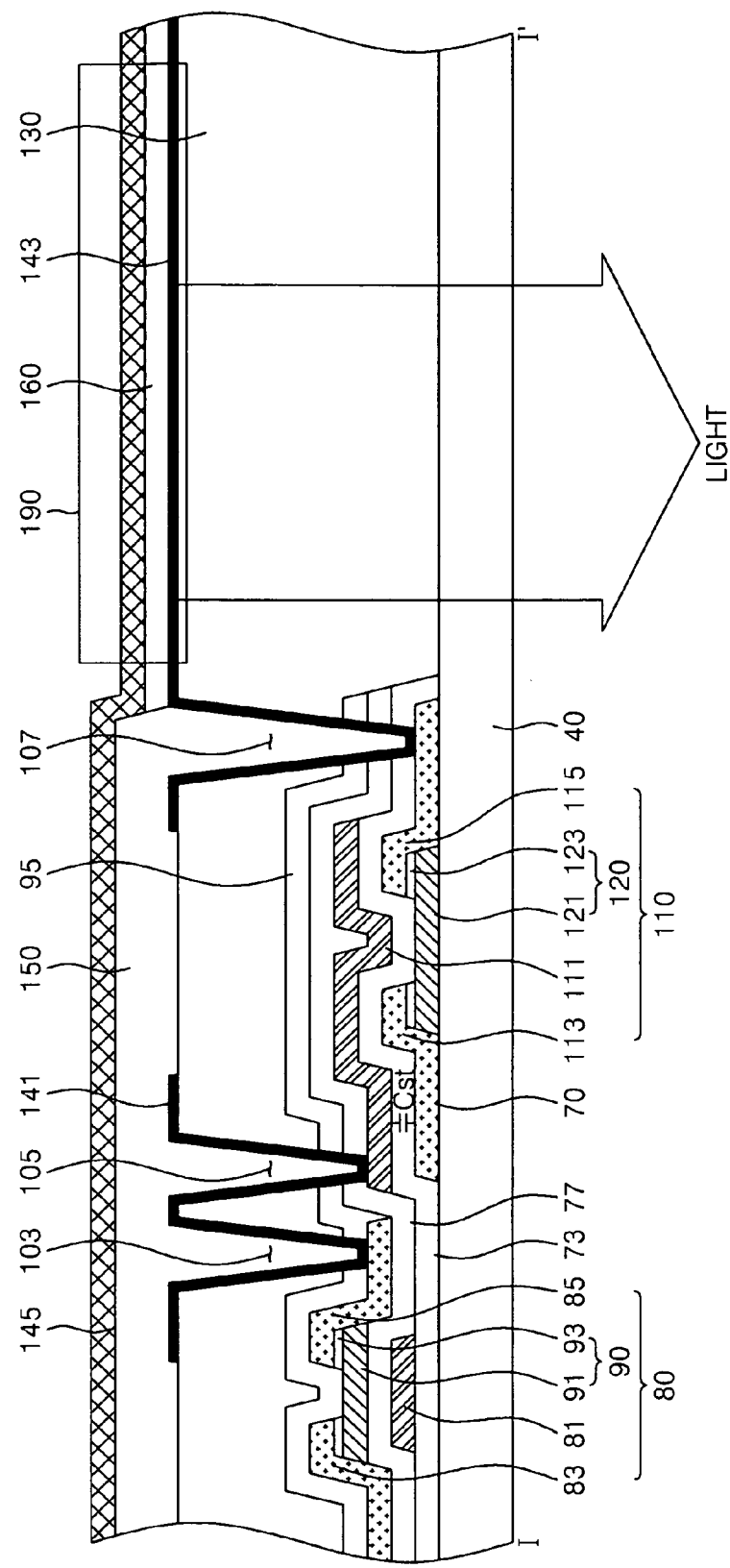
FIG. 2 is a cross-sectional view taken along line I-I' of FIG. 1.

FIG. 1 is a plane view illustrating an OLED device according to an embodiment of the present invention, and FIG. 2 is a cross-sectional view taken along line I-I' of FIG. 1.

In the OLED device according to the embodiment of the present invention, a unit pixel comprises a red ("R") sub-pixel, a green ("G") sub-pixel, a blue ("B") sub-pixel, and a white ("W") sub-pixel. The R sub-pixel, the green G sub-pixel, the blue B sub-pixel, and the white W sub-pixel have the same structure except for a color filter. FIGS. 1 and 2 show only a structure of the white W sub-pixel.

Referring to FIGS. 1 and 2, the OLED device comprises a substrate 40 which is divided into a first region and a second region for each unit pixel, switching elements 80 and 110 formed on the substrate 40, silicon nitride layers 73, 77 and 95, an overcoat layer 130 formed on the silicon nitride layers 73, 77 and 95 and the second region of the substrate 40, and an organic light emitting portion 190 electrically connected to the switching elements 80 and 110. The organic light emitting portion 190 comprises a first electrode 143, an organic light emitting layer 160 and a second electrode 145.

The substrate 40 comprises a plurality of unit pixels arranged in a matrix form and is made of a transparent insulating material such as glass or plastic so that light can be transmitted through the pixels. The switching elements 80 and 110 are formed over the first region of the substrate 40, and the organic light emitting portion 190 is formed over the second region of the substrate 40.

In more detail, a gate line 50, a data line 60, a power line 70, the switching thin film transistor ("TFT") 80, the driving TFT 110, the overcoat layer 130, and the organic light emitting portion 190 are formed on the substrate 40.

The gate line 50 supplies a gate signal to the switching TFT 80, the data line 60 supplies a data signal to the switching TFT 80, and the power line 70 supplies a power signal to the driving TFT 110.

In response to the gate signal supplied from the gate line 50, the switching TFT 80 is turned on to apply the data signal supplied from the data line 60 to a storage capacitor Cst and a second gate electrode 111 of the driving TFT 110. To this end, the switching TFT 80 comprises a first gate electrode 81 electrically connected to the gate line 50, a first source electrode 83 electrically connected to the data line 60, a first drain electrode 85 which faces the first source electrode 83 and is electrically connected to the second gate electrode 111 of the driving TFT 110 and the storage capacitor Cst, and a first semiconductor pattern 90 which has a channel area between the first source and drain electrodes 83 and 85. The first semiconductor pattern 90 comprises a first active layer 91 and a first ohmic contact layer 93 formed on portions of the first active layer 91 in which the channel area is not formed for ohmic contact with the first source and drain electrodes 83 and 85. The first active layer 91 may be made of amorphous silicon or poly crystalline silicon. Particularly, since the switching TFT 80 requires an excellent on-off characteristic, the first active layer 91 is preferably made of amorphous silicon which has an advantage in on-off operation.

In response to the data signal supplied to the second gate electrode 111, the driving TFT 110 controls an electric current to be applied from the power line 70 to the organic light emitting portion 190 to control the amount of light emitted from the organic light emitting portion 190. To this end, the driving TFT 110 comprises the second gate electrode 111 electrically connected to the first drain electrode 85 of the switching TFT 80 through a connecting electrode 141, the second source electrode 113 electrically connected to the power line 70, a second drain electrode 115 which faces the second source electrode 113 and is electrically connected to the first electrode 143 of the organic light emitting portion 190, and a second semiconductor pattern 120 which has a channel area between the second source and drain electrodes 113 and 115. The connecting electrode 141 electrically connects a portion of the first drain electrode 85 of the switching TFT 80 exposed by a first contact hole 103 and a portion of the second gate electrode 111 of the driving TFT 110 exposed by a second contact hole 105. The first contact hole 103 penetrates a passivation film 95 and the overcoat layer 130 to expose a portion of the first drain electrode 85, and the second contact hole 105 penetrates a second gate insulating layer 77, the passivation film 95 and the overcoat layer 130 to expose a portion of the second gate electrode 111.

The second semiconductor pattern 120 comprises a second active layer 121 formed to overlap the second gate electrode 111 with the first gate insulating layer 73 interposed therebetween and a second ohmic contact layer 123 formed on portions of the second active layer 121 in which the channel area is not formed for ohmic contact with the second source and drain electrodes 113 and 115. The second active layer 121 may be made of poly crystalline silicon or amorphous silicon in one example. Particularly, since the driving TFT 110 requires a characteristic that an electric current continuously flows through it during a light emitting period of the organic light emitting portion 190, the second active layer 121 is preferably made of poly crystalline silicon.

The storage capacitor Cst is formed such that the power line 70 and the second gate electrode 111 of the driving TFT 110 overlap each other with the first gate insulating layer 73 interposed therebetween. The storage capacitor Cst supplies a constant electric current to the driving TFT 110 by its charge voltage until a data signal of a next frame is supplied even though the switching TFT 80 is turned off, so that the organic light emitting portion 190 continuously emits light.

The overcoat layer 130 is formed at the predetermined thickness over the whole surface of the substrate 40 to cover a second region of the substrate 40, the switching TFT 80 and the driving TFT 110. The thickness of a portion of the overcoat layer 130 formed over the second region of the substrate 40 is described later. The overcoat layer 130 may be made of an organic insulating material such as acrylic-based material in one example. Particularly, the overcoat layer 130 is preferably made of polyacrylate.

The organic light emitting portion 190 comprises the first electrode 143 which is made of a transparent conductive material and formed on a portion of the overcoat layer 130 over the second region of the substrate 40, the organic light emitting layer 160 having a light emitting layer formed on the first electrode 143, and the second electrode 145 formed on the organic light emitting layer 160. The organic light emitting layer 160 comprises a hole injecting layer, a hole transporting layer, a light emitting layer, an electron transporting layer, and an electron injecting layer which are stacked on the first electrode 143. The organic light emitting layer 160 may have a three-layer structure in which light emitting layers which respectively realize R, G and B colors are sequentially stacked, a dual layer structure in which light emitting layers which have a complementary color relationship are stacked, or a single layer structure with a light emitting layer which realizes a while color. The light emitting layer contained in the organic light emitting layer 160 emits white light according to the amount of an electric current applied to the second electrode 145. The white light is emitted to a bottom of the substrate 40 via the first electrode 143.

The first electrode 143 faces the second electrode 145 with the organic light emitting layer 160 formed in a sub-pixel unit interposed therebetween. The first electrode 143 is independently formed on the overcoat layer 130 in each sub-pixel region. The first electrode 143 is electrically connected to a portion of the second drain electrode 115 of the driving TFT 110 via a third contact hole 107 which penetrates the first and second gate insulating layers 73 and 77, the passivation film 95 and the overcoat layer 130. The first electrode 143 is made of a transparent conductive material such as indium tin oxide ("ITO"), indium zinc oxide ("IZO"), tin oxide ("TO"), or indium tin zinc oxide ("ITZO") in one example.

An isolating wall 150 which is made of an organic insulating material and serves as an insulating layer is formed to cover the connecting electrode 141 and the exposed portion of the overcoat layer 130. The isolating wall 150 is patterned to expose the first electrode 143 so that the organic light emitting layer 160 may be formed on the first electrode 143.

The second electrode 145 is made of a material having an excellent electron supplying ability and an excellent reflectivity such as aluminum (Al), magnesium (Mg), silver (Ag), or calcium (Ca).

A structure of the unit pixel of the OLED device according to an embodiment of the present invention is described below with reference to the structure of the organic light emitting portion 190 described above and in FIG. 3.

Figure 3:
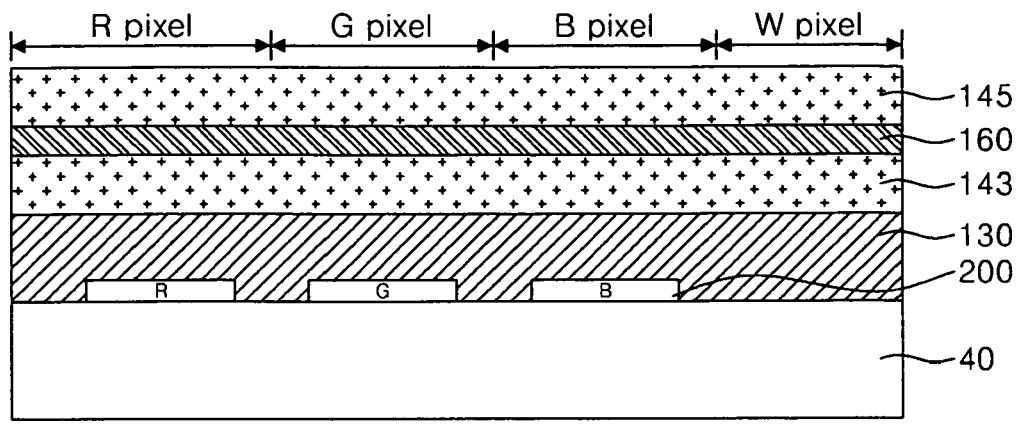
FIG. 3 is a cross-sectional view illustrating a unit pixel of the OLED device according to an embodiment of the present invention.

FIG. 3 is a cross-sectional view illustrating the unit pixel of the OLED device according to an embodiment of the present invention.

As shown in FIG. 3, the unit pixel of the OLED device according to the present invention comprises an R sub-pixel, a G sub-pixel, a B sub-pixel, and a W sub-pixel which realize red ("R"), green ("G"), blue ("B"), and white ("W") colors, respectively.

R, G and B color filters 200 are formed in R, G and B sub-pixel regions and realize R, G, B, W colors by using white light emitted from the organic light emitting layer 160. The white sub-pixel emits white light emitted from the organic light emitting layer 160 "as is", and so a white color filter is not formed in the white sub-pixel region. The R, G and B color filters 200 are formed by depositing red, green and blue pigments on the respective sub-pixel regions of the substrate 40 and patterning them. The overcoat layer 130, the first electrode 143, the organic light emitting layer 160, and the second electrode 145 are sequentially stacked on the substrate 40 having the R, G and B color filters 200, which has been already described above.

The silicon nitride layer and the overcoat layer which are formed at the optimum thickness to improve light transmittance of the OLED device are described with reference to FIGS. 4 to 7, focusing on the white sub-pixel shown in FIG. 3.

Figure 4:
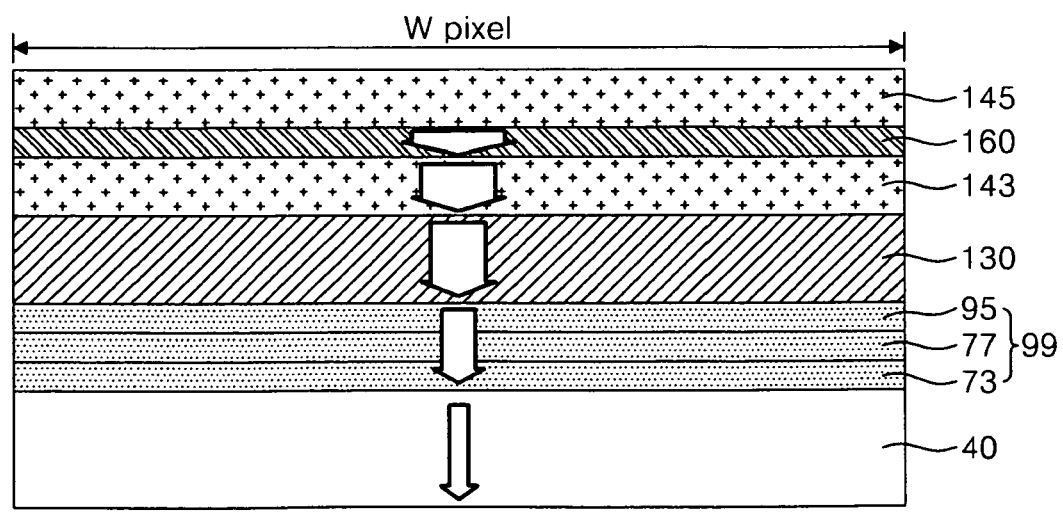
FIG. 4 is a cross-sectional view illustrating light transmittance of a white sub-pixel according to an embodiment of the present invention.
Figure 5:
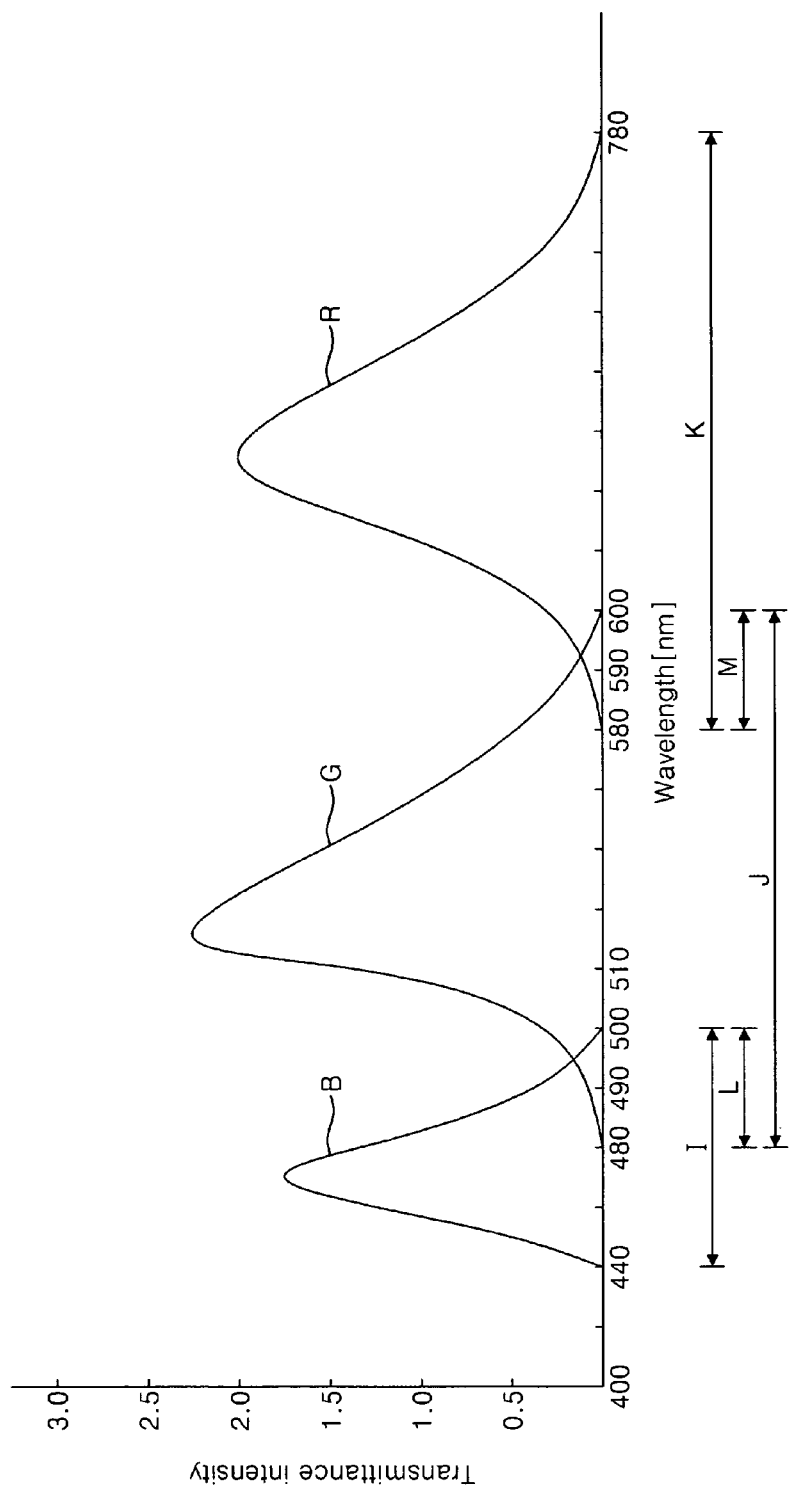
FIG. 5 is a graph illustrating light transmittance of the white sub-pixel according to an embodiment of the present invention.
Figure 6:
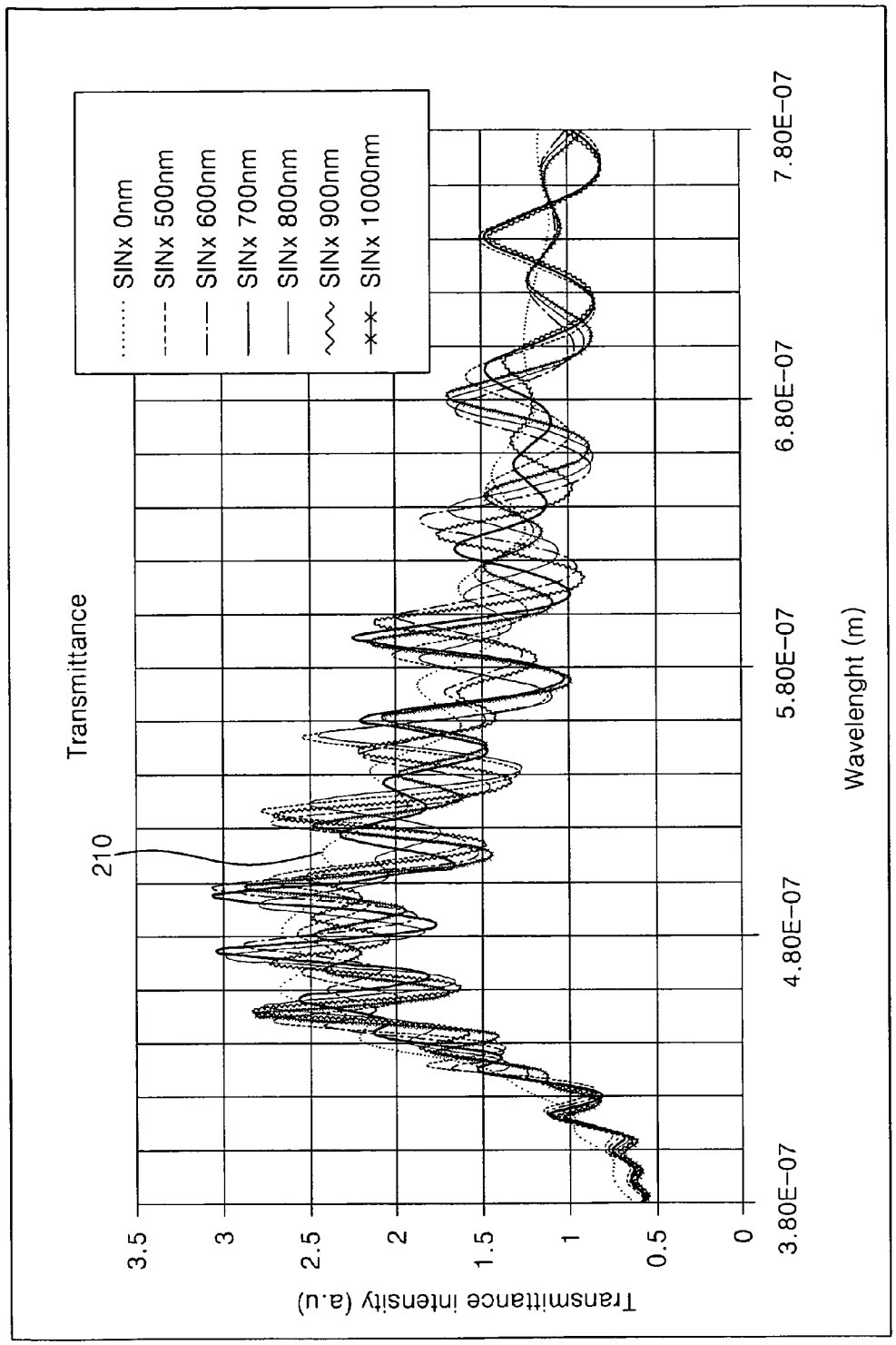

FIG. 4 is a cross-sectional view illustrating light transmittance of the white sub-pixel according to an embodiment of the present invention, and FIG. 5 is a graph illustrating light transmittance of the white sub-pixel according to the embodiment of the present invention. FIGS. 6 and 7 are graphs illustrating light transmittance of the silicon nitride layer and the overcoat layer according to their thickness according to the embodiment of the present invention, respectively.

Referring to FIG. 4, a silicon nitride layer 99 comprises the first and second gate insulating layers 73 and 77 and the passivation film 95 shown in FIG. 2. Transmittance of light emitted from the organic light emitting layer 160 is gradually reduced while it transmits the first electrode 143 and the silicon nitride layer 99. The thickness of the silicon nitride layer 99 affects light transmittance. The light transmittance according to the thickness of the silicon nitride layer 99 will be described with reference to FIG. 5. The FIG. 5 is a graph illustrating transmittance of light which has been transmitted through the silicon nitride layer 99 in a state that the overcoat layer 130 is formed at the predetermined thickness (e.g., 2 μm).

In the graph of FIG. 5, an x-axis denotes a wavelength of light emitted from the organic light emitting layer 160, and a y-axis denotes transmittance intensity. Curved lines R, G and B represent wavelength distribution regions of R, G and B elements of transmitted light according to the thickness of the overcoat layer 130. Here, the transmittance intensity is a relative value. For example, when it is assumed that the total amount of light generated from the organic light emitting layer 160 is "1", transmittance of light which is reflected by the second electrode 145 and then transmitted through the first electrode 143 may have a value d which is greater than "1".

White light emitted from the organic light emitting layer 160 is represented by a sum of R, G and B wavelength bands. The R wavelength band has a range of 580 nm to 780 nm, the G wavelength band has a range of 480 nm to 600 nm, and the B wavelength band has a range of 440 nm to 500 nm.

Table 1 shows transmittances of the R, G and B wavelength bands according to the thickness of the silicon nitride layer 99.

TABLE 1

| Wavelength | Section | 0 μm | 0.5 μm | 0.6 μm | 0.7 μm | 0.8 μm | 0.9 μm | 1.0 μm |
|---|---|---|---|---|---|---|---|---|
| B | I | 127 | 118 | 115 | 113 | 112 | 111 | 108 |
|   | L | 50 | 48 | 47 | 47 | 47 | 46 | 47 |
|   | I − L | 76 | 71 | 68 | 66 | 66 | 65 | 62 |
| G | J | 200 | 190 | 186 | 186 | 184 | 178 | 180 |
|   | L | 74 | 71 | 67 | 65 | 67 | 68 | 65 |

TABLE 1-continued

| Wavelength | Section | 0 µm | 0.5 µm | 0.6 µm | 0.7 µm | 0.8 µm | 0.9 µm | 1.0 µm |
|---|---|---|---|---|---|---|---|---|
|  | M | 29 | 33 | 31 | 35 | 31 | 32 | 33 |
|  | J − (L + M) | 96 | 86 | 88 | 86 | 86 | 78 | 81 |
| R | K | 241 | 227 | 233 | 227 | 227 | 226 | 225 |
|  | M | 29 | 33 | 31 | 35 | 31 | 32 | 33 |
|  | K − M | 212 | 195 | 202 | 192 | 196 | 194 | 191 |

Transmittances of the R, G and B wavelength bands are measured while changing the thickness of the silicon nitride layer 99 within a range of 0 µm to 1.0 µm and increasing it in a unit of 0.1 µm from 0.5 µm. The optimum thickness in which R, G and B are best represented is found out by calculating transmittances of respective wavelength bands shown according to the thickness of the silicon nitride layer 99. In more detail, the thickness of the silicon nitride layer 99 which shows the optimum transmittance is found such that transmittances of the whole regions I, J and K respectively corresponding to the B, G and R wavelength bands are calculated by an integral calculus, and subtracted therefrom are transmittances obtained by calculating overlapping regions L and M. For example, transmittance of the B wavelength band is represented by "I−L", transmittance of the G wavelength band by "J−(L+M)", and transmittance of the R wavelength band by "K−M".

As shown in Table 1, the most excellent transmittance is shown in case where the thickness of the silicon nitride 99 is 0 µm. In order to improve transmittance of the OLED device, it is preferable to remove the portion of the silicon nitride layer 99 corresponding to the organic light emitting layer 160.

FIG. 6 is a graph illustrating light transmittance according to the thickness of the silicon nitride layer according to an embodiment of the present invention.

Transmittance according to the thickness of the silicon nitride layer based on Table 1 is shown in detail in the graph of FIG. 6. In the graph of FIG. 6, an x-axis denotes a wavelength of light which has transmitted the silicon nitride layer, and a y-axis denotes transmittance intensity. Curved lines of FIG. 6 denote a wavelength and transmittance intensity according to the thickness of the silicon nitride layer. A first curve line 210 shows transmittance when the thickness of the silicon nitride layer is 0 µm. The first curve line 210 shows a relatively high integral value according to transmittance intensity in the whole wavelength region compared to other curved lines. Therefore, the most excellent transmittance is shown when the thickness of the silicon nitride layer is 0 µm.

The optimum thickness of the overcoat layer 130 was described with reference to FIG. 5 in the same way as the silicon nitride layer 99. The overcoat layer 130 is preferably made of polyacrylate. In order to find the optimum thickness of the overcoat layer 130 in a state that the transmittance of the silicon nitride layer 99 is optimum, a portion of the silicon nitride layer 99 corresponding to the organic light emitting layer 160 is formed at the thickness of 0 µm. The overcoat layer 130 is formed in a state that a portion of the silicon nitride layer 99 corresponding to the organic light emitting layer 160 is removed.

Light emitted from the organic light emitting layer 160 show R, G and B wavelength bands. The R wavelength band has a range of 580 nm to 780 nm, the G wavelength band has a range of 480 nm to 600 nm, and the B wavelength band has a range of 440 nm to 500 nm. Table 2 shows transmittances of the R, G and B wavelength bands according to the thickness of the overcoat layer 130.

TABLE 2

| Wavelength | Section | 0 µm | 1.1 µm | 1.6 µm | 2.1 µm | 2.6 µm | 3.1 µm |
|---|---|---|---|---|---|---|---|
| B | I | 109 | 117 | 120 | 112 | 108 | 110 |
|  | L | 41 | 44 | 50 | 49 | 47 | 45 |
|  | I − L | 68 | 73 | 70 | 62 | 62 | 65 |
| G | J | 178 | 181 | 181 | 178 | 180 | 178 |
|  | L | 58 | 63 | 66 | 66 | 65 | 67 |
|  | M | 40 | 38 | 24 | 27 | 33 | 28 |
|  | J − (L + M) | 80 | 79 | 91 | 85 | 81 | 83 |
| R | K | 256 | 222 | 221 | 228 | 225 | 223 |
|  | M | 40 | 38 | 24 | 27 | 33 | 28 |
|  | K − M | 216 | 184 | 197 | 201 | 191 | 195 |

Transmittances of the R, G and B wavelength bands are measured while changing the thickness of the overcoat layer 130 within a range of 0 µm to 3.1 µm and increasing it in a unit of 0.5 µm from 1.1 µm. The optimum thickness in which R, G and B are best represented is found out by calculating transmittances of respective wavelength bands shown according to the thickness of the overcoat layer. In more detail, the thickness of the overcoat layer 130 which shows the optimum transmittance is found such that transmittances of the whole regions I, J and K respectively corresponding to the R, G and B wavelength band are calculated by an integral calculus, and from transmittances obtained through the integral calculus, transmittances obtained by calculating regions L and M which overlap another color wavelength regions are subtracted. For example, in case of B, a value of "I−L" shows the highest value at the thickness of 1.1 µm, and in case of G, a value of "J−(L+M)" shows the highest value at the thickness of 1.6 µm. In case of R, a value of "K−M" shows the highest value at the thickness of 0 µm, but since the overcoat layer is necessary for the color filter, the next highest value is at the thickness 2.1 µm.

As shown in Table 2, since R, G and B show the highest value when the overcoat layer 130 has the thickness of 1.1 µm to 2.1 µm, it is preferable to form the overcoat layer 130 at the thickness of 1.1 µm~2.1 µm.

FIG. 7 is a graph illustrating light transmittance according to the thickness of the overcoat layer (OC) according to an embodiment of the present invention.

Transmittance according to the thickness of the overcoat layer 130 based on Table 2 is shown in detail in FIG. 7. In the graph of FIG. 7, an x-axis denotes a wavelength of light which has transmitted the overcoat layer, and a y-axis denotes transmittance intensity. Curved lines of FIG. 7 denote a wavelength and transmittance intensity according to the thickness of the overcoat layer. A second curve line 220 shows transmittance when the thickness of the overcoat layer is 1.6 µm. The second curve line 220 shows a relatively high integral value according to transmittance intensity in the whole wavelength region compared to other curved lines. Therefore, the most excellent transmittance is shown when the thickness of the planarization nitride layer is 1.6 µm.

The silicon nitride layer 99 and the overcoat layer 130 according to an embodiment of the present invention has been described focusing on the sub-pixel structure of R, G, B, and W, but they can be applied to the sub-pixel structure of R, G and B.

A method for manufacturing the OLED device according to an embodiment of the present invention is described below in detail with reference to FIGS. 8A to 8K.

FIGS. 8A to 8K are cross-sectional views illustrating a process for manufacturing the OLED device according to an embodiment of the present invention.

Figure 8A:
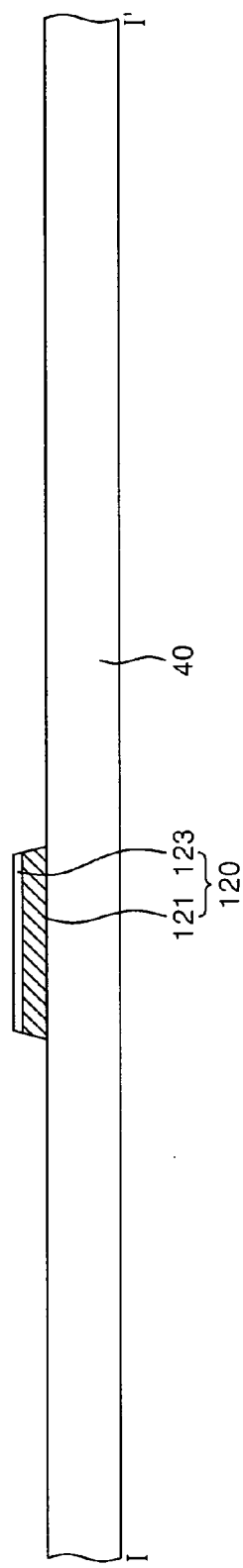

Referring to FIG. 8A, a second semiconductor pattern 120 having a second active layer 121 and a second ohmic contact layer 123 of a driving TFT 110 (FIG. 8B) is formed on a substrate 40. Preferably, the second active layer 121 and the second ohmic contact layer 123 are made of poly crystalline silicon in consideration of a driving characteristic of the driving TFT 110. In order to form the second active layer 121, an amorphous silicon layer and an n+ doped amorphous silicon layer are deposited over the whole surface of the substrate 40 at the predetermined thickness. The amorphous silicon layer is crystallized by a technique using a laser or a solid phase crystallization technique. The solid phase crystallization technique is usually used for a large-scaled substrate.

The crystalline silicon layer is then patterned by a photolithography process and an etching process to form the second active layer 121 and the second ohmic contact layer 123 as shown in FIG. 8A.

Figure 8B:
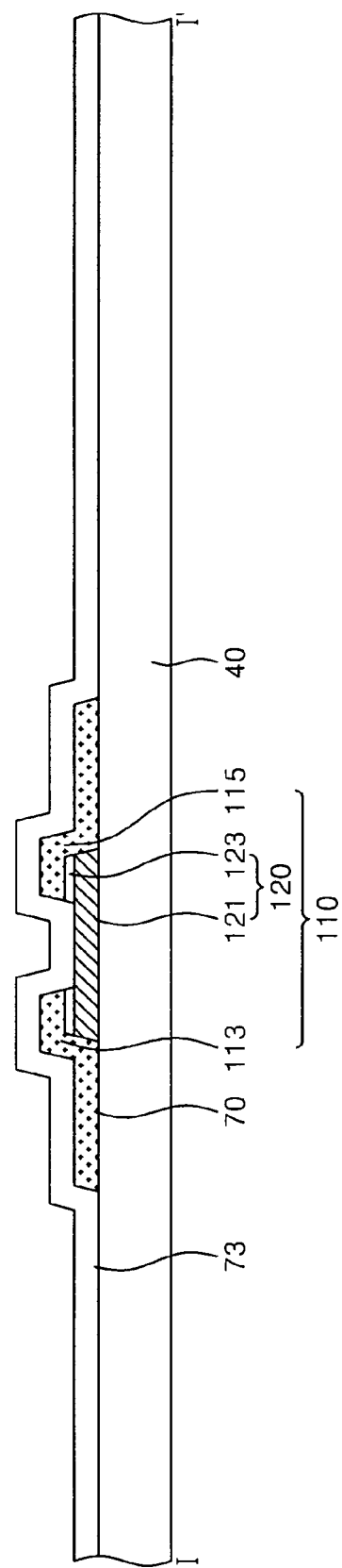

Referring to FIG. 8B, a driving metal pattern having a power line 70, a second source electrode 113, and a second drain electrode 115 is formed. In more detail, a conductive metal layer is deposited over the whole surface of the substrate 40 by using a sputtering technique and then patterned by a photolithography process and an etching process to form the power line 70, the second source electrode 113 and the second drain electrode 115. A portion of the second ohmic contact layer 123 which is not covered with the second source electrode 113 and the second drain electrode 115 is removed by an etching process, thereby forming a channel comprised of poly crystalline silicon.

A first gate insulating layer 73 is formed over the whole surface of the substrate 40. In one example, an inorganic insulating material layer such as a silicon oxide ("SiOx") layer or a silicon nitride ("SiNx") layer is formed over the whole surface of the substrate 40 by a plasma enhanced chemical vapor deposition ("PECVD") technique to form the first gate insulating layer 73.

Figure 8C:
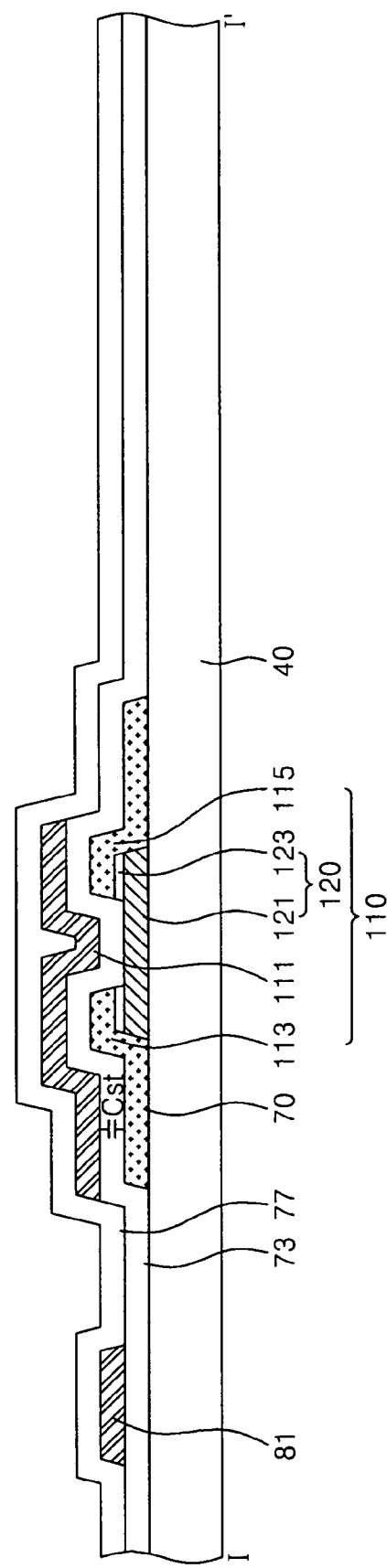

Referring to FIG. 8C, a gate metal pattern having a first gate electrode 81, a second gate electrode 111 and a gate line is formed on the first gate insulating layer 73. A second gate insulating layer 77 is formed over the whole surface of the substrate 40 to cover the gate metal pattern.

In one example, a conductive metal layer is deposited on the first gate insulating layer 73 by a sputtering technique and then patterned by a photolithography process and an etching process to form the first and second gate electrodes 81 and 111. At this time, the gate line is formed together to be electrically connected to the first gate electrode 81.

Then, the second gate insulating layer 77 is formed over the whole surface of the substrate 40 having the first and second gate electrodes 81 and 111. In one example, the second gate insulating layer 77 is formed in the same way as the first gate insulating layer 73, and thus a detailed description on that is omitted.

Figure 8D:
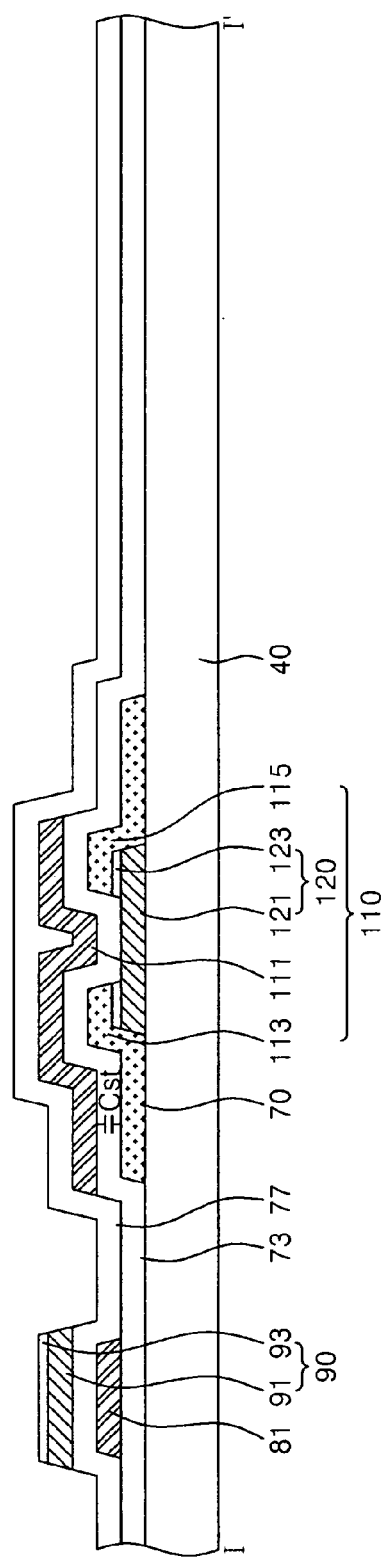

Referring to FIG. 8D, a first semiconductor pattern 90 having a first active layer 91 and a first ohmic contact layer 93 is formed on a portion of the second gate insulating layer 77 over the first gate electrode 81. The first active layer 91 and the first ohmic contact layer 93 are preferably made of amorphous silicon in consideration of a driving characteristic of a switching TFT 80. Therefore, the amorphous silicon layer is deposited and then patterned without a crystallization process to form the first active layer 91 and the first ohmic contact layer 93.

Figure 8E:
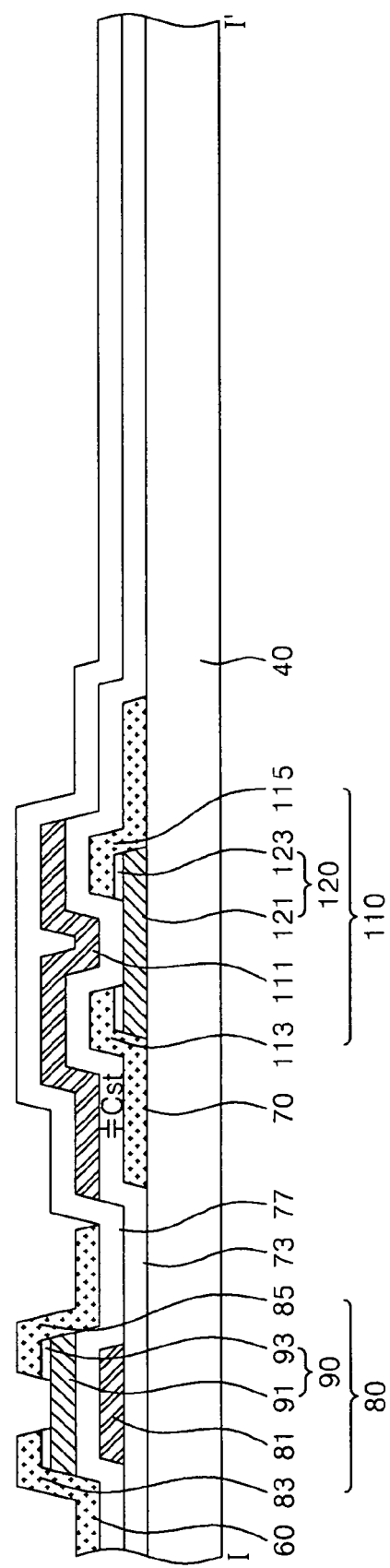

Referring to FIG. 8E, a data metal pattern having a data line 60, a first source electrode 83 and a first drain electrode 85 is formed over the substrate 40 having the first semiconductor pattern 90. The method for forming the first source and drain electrodes 83 and 85 is substantially the same as the method for forming the second source and drain electrodes 113 and 115, and thus its description is omitted.

Figure 8F:
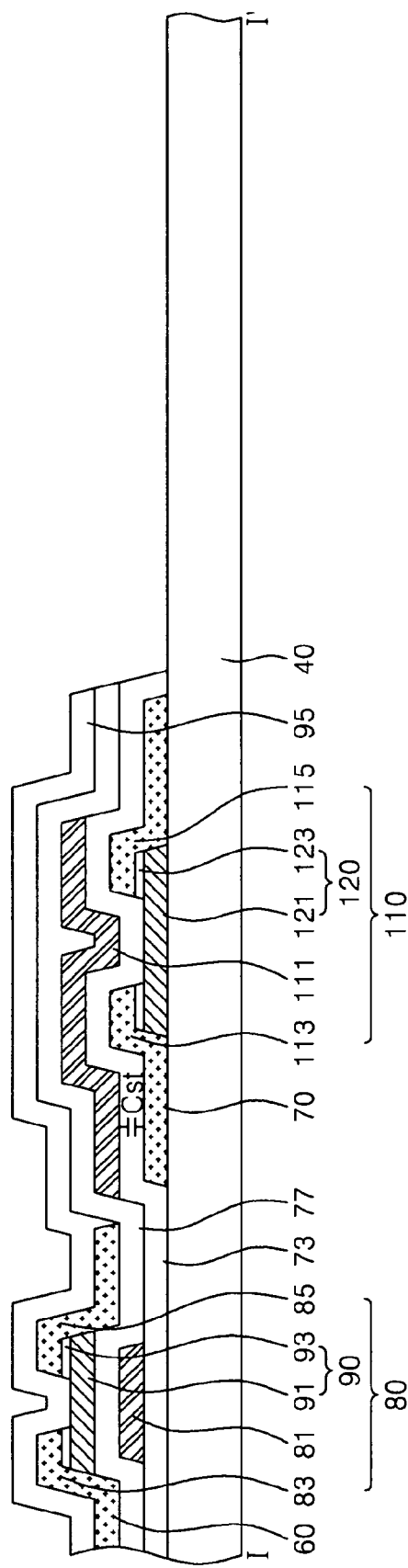

Referring to FIG. 8F, a passivation film 95 is formed over the whole surface of the substrate 40 and then patterned to expose a second region of the substrate 40.

The passivation film 95 is made of an inorganic insulating material such as SiNx. The passivation film 95 and the first and second gate insulating layers 73 and 77 are patterned to expose the second region of the substrate 40 where the switching TFT 80 and the driving TFT 110 are not formed. Portions of the passivation film 95 and the first and second insulating layers 73 and 77 corresponding to the organic light emitting portion 190 are removed.

Figure 8G:
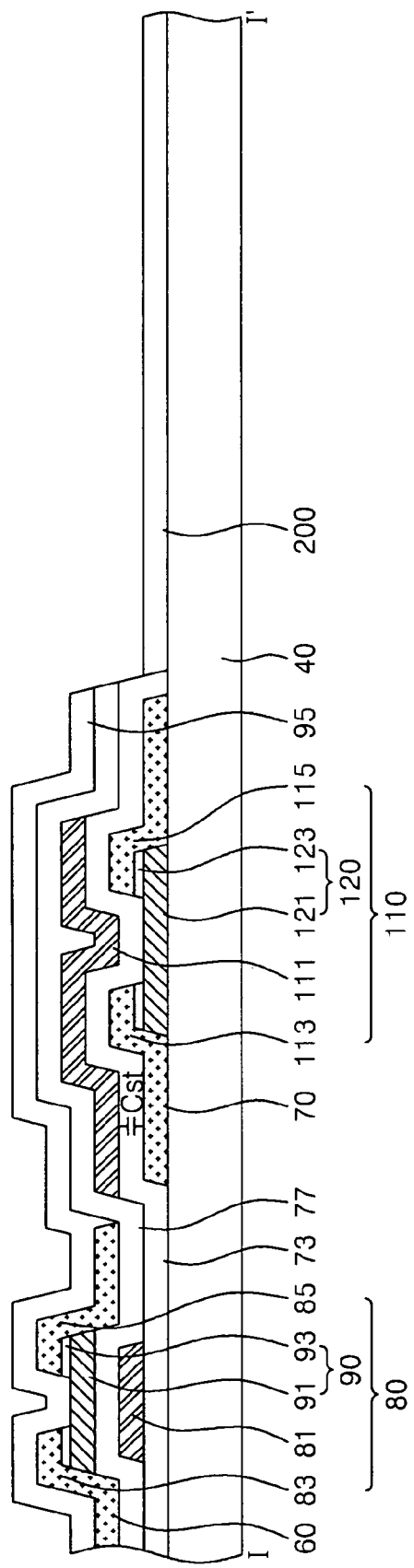

Referring to FIG. 8G, in the case of the R, G and B sub-pixels, a color filter 200 is formed on the exposed portion of the substrate 40. The color filter layer 200 is formed such that a pigment of R, G or B is stacked on each sub-pixel region and patterned by a photolithography process.

On the other hand, in case of the white sub-pixel, a color filter 200 is not necessary. Hereinafter, the subsequent processes are described focusing on the white sub-pixel.

Referring to FIG. 8H, an overcoat layer 130 having first, second, and third contact holes 103, 105 and 107 is formed over the whole surface of the substrate 40.

The overcoat layer 130 is formed by a spin coating technique or a spinless coating technique in one example. The first to third contact holes 103, 105 and 107 are formed by patterning at least two of the first and second gate insulating layers 73 and 77, and the passivation film 95 and the overcoat layer 130 by a photolithography process and an etching process. The first contact hole 103 penetrates the passivation film 95 and the overcoat layer 130 to expose a portion of the first drain electrode 85 of the switching TFT 80, the second contact hole 105 penetrates the second gate insulating layer 77, the passivation film 95 and the overcoat layer 130 to expose a portion of the second gate electrode 111 of the driving TFT 110, and the third contact hole 107 penetrates the first and second gate insulating layers 73 and 77, the passivation film 95, and the overcoat layer 130 to expose a portion of the second drain electrode 115 of the driving TFT 110.

The overcoat layer 130 is preferably formed to have a thickness of about 1.1 μm to about 2.1 μm in order to improve transmittance, and more preferably to have a thickness of about 1.6 μm. The optimum thickness of the overcoat layer 130 has been described above with reference to FIGS. 4 to 7.

Referring to FIG. 8I, a transparent conductive pattern having a connecting electrode 141 and a first electrode 143 is formed on the overcoat layer 130.

In one example, a transparent conductive material layer is deposited on the overcoat layer 130 and then patterned by a photolithography process and an etching process to form the connecting electrode 141 and the first electrode 143. The transparent conductive material layer is preferably made of ITO, TO, IZO, and/or ITZO.

Figure 8J:
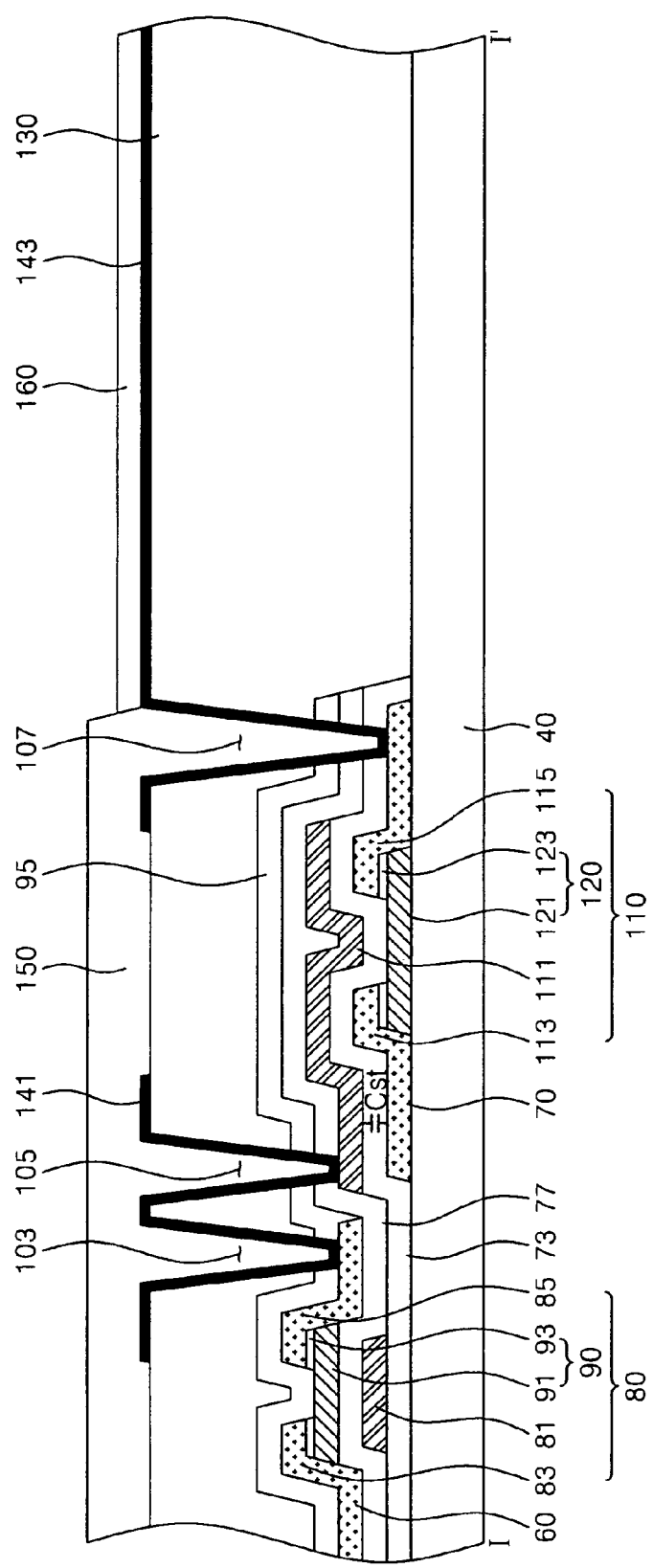

Referring to FIG. 8J, an isolating wall 150 is formed, and an organic light emitting layer 160 is formed.

The isolating wall 150 is formed such that an organic insulating material layer is deposited over the whole surface of the substrate 40 and then patterned by a photolithography process and an etching process to expose the first electrode 143 while forming a pixel hole.

The organic light emitting layer 160 is formed on the pixel hole through which the first electrode 143 is exposed. The organic light emitting layer 160 may have a three-layer structure in which light emitting layers which respectively realize R, G and B colors are sequentially stacked, a dual layer structure in which light emitting layers which have a complementary color relationship are stacked, or a single layer structure in which respective light emitting layers realize R, G or B colors, respectively.

Referring to FIG. 8K, a second electrode 145 is formed over the whole surface of the substrate 40. In one example, a metal layer is deposited to cover the isolating wall 150 and the organic light emitting layer 160. The second electrode 145 is made of a metal with high reflectivity such as aluminum (Al), magnesium (Mg), silver (Ag), or calcium (Ca).

As described above, according to the present invention, since the silicon nitride layer and the overcoat layer are formed at the optimum thickness, transmittance of light which transmits a bottom is significantly improved, thereby improving the color gamut and display quality.

Although the present invention has been described with reference to certain embodiments thereof, it will be understood by those skilled in the art that a variety of modifications and variations may be made to the present invention without departing from the spirit or scope of the present invention defined in the appended claims, and their equivalents.

What is claimed is:

1. A method for manufacturing an organic light emitting display device, the method comprising:
    forming a switching element and a silicon nitride layer over a substrate;
    patterning and removing a portion of the silicon nitride layer formed on a light emitting region;
    forming an overcoat layer on the silicon nitride layer, wherein a portion of the overcoat layer corresponding to the light emitting region has a thickness between about 1.1 µm and about 2.1 µm;
    forming a first electrode over the light emitting region, the first electrode being electrically connected to the switching element;
    forming an organic light emitting layer in the light emitting region; and
    forming a second electrode on the organic light emitting layer,
    wherein a light emitted from the organic light emitting layer exits to an exterior after passing through the overcoat layer and the substrate in the light emitting region where the silicon nitride layer is absent.

2. The method of claim 1, wherein the overcoat layer is formed at a thickness of about 1.6 µm.

3. The method of claim 1, wherein forming the switching element comprises:
    forming a first thin film transistor electrically connected to a gate line and a power line with a first gate insulating layer interposed between the gate line and the power line; and
    forming a second thin film transistor electrically connected to the gate line and a data line with a second gate insulating layer interposed between the gate line and the data line.

4. The method of claim 3, wherein forming the switching element further comprises forming a passivation film to protect the switching element.

5. The method of claim 4, wherein forming the passivation film further comprises patterning and removing a portion of the silicon nitride layer having the passivation film and the first and second gate insulating layers which overlaps the light emitting region.

6. The method of claim 5, further comprising forming a color filter in red, green, blue and white sub-pixels after forming the passivation film.

7. The method of claim 6, wherein forming the color filter comprises forming red, green and blue color filters below the organic light emitting layer.

8. An organic light emitting display device, comprising:
    a substrate having a first region and a second region which are divided for each pixel;
    a switching element disposed on the first region of the substrate;
    a silicon nitride layer disposed on the switching element in the first region;
    an overcoat layer disposed on the silicon nitride layer and the second region of the substrate; and
    an organic light emitting portion that emits light and is disposed on a portion of the overcoat layer corresponding to the second region, the organic light emitting portion being electrically connected to the switching element,
    wherein the light exits to an exterior after passing through the overcoat layer and the substrate in the second region where the silicon nitride layer is absent.

9. The organic light emitting display device of claim 8, wherein the overcoat layer has a thickness between about 1.1 µm and about 2.1 µm.

10. The organic light emitting display device of claim 9, wherein the overcoat layer has a thickness of 1.6 µm.

11. The organic light emitting display device of claim 9, wherein the organic light emitting portion comprises a first electrode, an organic light emitting layer and a second electrode sequentially formed on the overcoat layer.

12. The organic light emitting display device of claim 11, further comprising a color filter formed on the substrate below the organic light emitting layer.

13. The organic light emitting display device of claim 12, wherein the pixel comprises red, green, blue, and white sub-pixels.

14. The organic light emitting display device of claim 12, wherein the pixel comprises red, green, and blue sub-pixels.

15. The organic light emitting display device of claim 8, wherein the overcoat layer is made of an acrylic-based material.

16. The organic light emitting display device of claim 15, wherein the overcoat layer is made of polyacrylate.

* * * * *